United States Patent
Peterson et al.

(10) Patent No.: US 10,529,529 B2
(45) Date of Patent: Jan. 7, 2020

(54) ELECTRON-BEAM SPOT OPTIMIZATION

(71) Applicant: Moxtek, Inc., Orem, UT (US)

(72) Inventors: Dustin Peterson, Spanish Fork, UT (US); Richard Zimmerman, Payson, UT (US); Vince Jones, Cedar Hills, UT (US); Eric Miller, Provo, UT (US)

(73) Assignee: Moxtek, Inc., Orem, UT (US)

( * ) Notice: Subject to any disclaimer, the term of this patent is extended or adjusted under 35 U.S.C. 154(b) by 520 days.

(21) Appl. No.: 15/424,270

(22) Filed: Feb. 3, 2017

(65) Prior Publication Data

US 2017/0309436 A1 Oct. 26, 2017

Related U.S. Application Data

(60) Provisional application No. 62/325,007, filed on Apr. 20, 2016.

(51) Int. Cl.
*H01J 35/14* (2006.01)
*H01J 35/16* (2006.01)
(Continued)

(52) U.S. Cl.
CPC ............ *H01J 35/14* (2013.01); *H01J 35/066* (2019.05); *H01J 35/147* (2019.05);
(Continued)

(58) Field of Classification Search
CPC .. H05G 1/00; H05G 1/02; H05G 1/04; H05G 1/08; H05G 1/10; H05G 1/26; H05G 1/30; H05G 1/52; A61B 6/40; A61B 6/4021; A61B 6/44; A61B 2560/00; A61B 2560/02; A61B 2560/04; A61B 2560/0406; H01J 35/00; H01J 35/02; H01J 35/025; H01J 35/04; H01J 35/045; H01J 35/066; H01J 35/14; H01J 35/147; H01J 35/153; H01J 35/16; H01J 35/165; H01J 2203/00; H01J 2203/02; H01J 37/00; H01J 37/02; H01J 37/023; H01J 37/04; H01J 37/06;
(Continued)

(56) References Cited

U.S. PATENT DOCUMENTS

| 4,356,400 A | 10/1982 | Polizzi et al. |
| 2004/0090166 A1* | 5/2004 | Sanders ................. H01J 35/14 313/448 |

(Continued)

FOREIGN PATENT DOCUMENTS

JP 2015/191795 A 11/2015

*Primary Examiner* — Anastasia Midkiff
(74) *Attorney, Agent, or Firm* — Thorpe, North & Western, LLP

(57) ABSTRACT

Electron beam spot characteristics can be tuned in each x-ray tube by moving a focusing-ring along a longitudinal-axis of the x-ray tube. The focusing-ring can then be immovably fastened to the x-ray tube.

Figure 1:
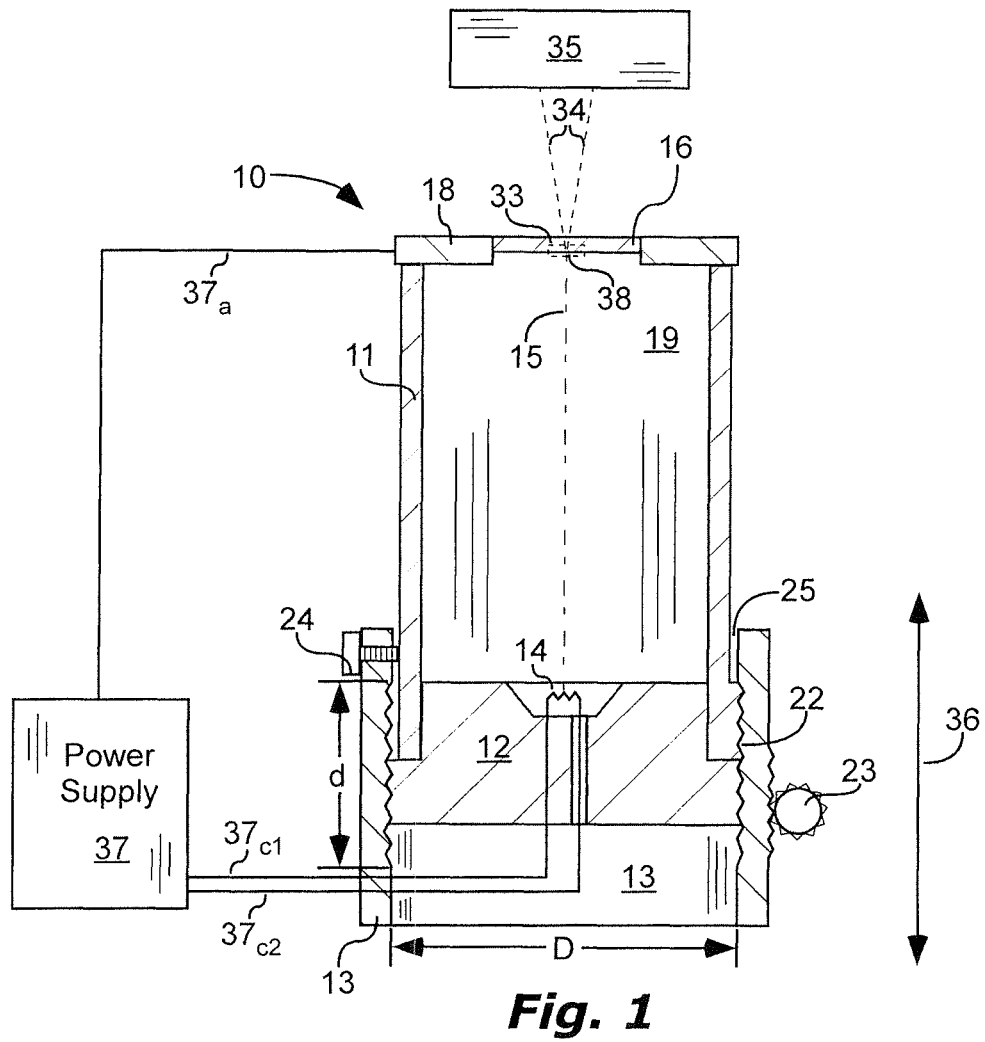

An x-ray source can include an x-ray tube and a focusing-ring. The focusing-ring can at least partially encircle an electron-emitter, a cathode, an evacuated-enclosure, or combinations thereof. The focusing-ring can be located outside of a vacuum of the evacuated enclosure. The focusing-ring can adjust an electron-beam spot on a target material of the x-ray tube when moved along a longitudinal-axis extending linearly from the electron-emitter to the target material.

20 Claims, 2 Drawing Sheets

(51) Int. Cl.
*H01J 37/065* (2006.01)
*H01J 35/06* (2006.01)
*H01J 37/21* (2006.01)
*H01J 37/063* (2006.01)
*H01J 37/15* (2006.01)
*H05G 1/52* (2006.01)

(52) U.S. Cl.
CPC .......... *H01J 35/153* (2019.05); *H01J 35/165* (2013.01); *H01J 37/063* (2013.01); *H01J 37/065* (2013.01); *H01J 37/15* (2013.01); *H01J 37/21* (2013.01); *H05G 1/52* (2013.01); *H01J 2229/4813* (2013.01); *H01J 2229/4831* (2013.01); *H01J 2229/70* (2013.01); *H01J 2229/8901* (2013.01); *H01J 2237/032* (2013.01); *H01J 2237/083* (2013.01); *H01J 2237/2482* (2013.01)

(58) Field of Classification Search
CPC ...... H01J 37/063; H01J 37/065; H01J 37/147; H01J 37/15; H01J 37/153; H01J 37/16; H01J 37/21; H01J 37/24; H01J 37/241; H01J 37/248; H01J 2229/00; H01J 2229/48; H01J 2229/4803; H01J 2229/481; H01J 2229/4813; H01J 2229/4824; H01J 2229/4831; H01J 2229/58; H01J 2229/582; H01J 2229/583; H01J 2229/5835; H01J 2229/70; H01J 2229/86; H01J 2229/89; H01J 2229/8901; H01J 2229/96; H01J 2229/964; H01J 2235/00; H01J 2235/02; H01J 2235/06; H01J 2235/16; H01J 2237/00; H01J 2237/02; H01J 2237/024; H01J 2237/0245; H01J 2237/03; H01J 2237/032; H01J 2237/04; H01J 2237/049; H01J 2237/0492; H01J 2237/04924; H01J 2237/06; H01J 2237/061; H01J 2237/063; H01J 2237/06375; H01J 2237/083; H01J 2237/15; H01J 2237/16; H01J 2237/21; H01J 2237/248; H01J 2237/2482; H01J 2237/2485

See application file for complete search history.

(56) References Cited

U.S. PATENT DOCUMENTS

| | | | |
|---|---|---|---|
| 2009/0238341 A1* | 9/2009 | Kawamura | A61B 6/04 378/162 |
| 2010/0020938 A1 | 1/2010 | Koch et al. | |
| 2010/0290595 A1 | 11/2010 | Al-Sadah et al. | |
| 2012/0148027 A1* | 6/2012 | Jeong | H01J 35/065 378/106 |
| 2014/0219424 A1 | 8/2014 | Smith et al. | |
| 2015/0187533 A1* | 7/2015 | Dinu-Gurtler | G03F 7/70058 355/67 |
| 2015/0303024 A1 | 10/2015 | Harker et al. | |

* cited by examiner

ELECTRON-BEAM SPOT OPTIMIZATION

CLAIM OF PRIORITY

This application claims priority to U.S. Provisional Patent Application No. 62/325,007, filed on Apr. 20, 2016, which is incorporated herein by reference in its entirety.

FIELD OF THE INVENTION

The present application is related to x-ray sources.

BACKGROUND

Customers of x-ray tubes often desire consistency of shape, size, and location of x-ray emission for all x-ray tubes of a given model. This is especially important if the customer is replacing an x-ray tube on an instrument that is already optimized for emitting x-rays to a specific location. The shape, size, and location of x-ray emission is determined by an electron-beam spot on a target material inside of the x-ray tube. Due to variation in the manufacturing process, each x-ray tube of a given model can have a different electron-beam spot shape, size, and location. It would be beneficial to the customer to reduce this variation between x-ray tubes of a given model.

SUMMARY

It has been recognized that it would be advantageous to reduce variation between x-ray tubes of a given model. The present invention is directed to methods of tuning an electron-beam spot on a target material in an x-ray tube, and various embodiments of x-ray sources, that satisfy these needs. Each embodiment may satisfy one, some, or all of these needs.

The method can comprise (1) energizing the x-ray tube to cause: (a) emission of electrons from an electron-emitter to the target material; (b) creating an electron-beam spot where the electrons impinge on the target material; and (c) emission of x-rays from the target material; (2) evaluating the electron-beam spot with respect to a predetermined characteristic; and (3) moving a focusing-ring along a longitudinal-axis of the x-ray tube to tune the electron-beam spot to the predetermined characteristic, the longitudinal-axis extending from the electron-emitter inside the x-ray tube to the target material.

The x-ray source can include an x-ray tube and a focusing-ring. The focusing-ring can at least partially encircle portions of the x-ray tube, such as for example all or part of the electron-emitter, the cathode, the evacuated-enclosure, or combinations thereof. The focusing-ring can be located outside of a vacuum of the evacuated enclosure. The focusing-ring can adjust an electron-beam spot, on a target material on an anode of the x-ray tube, when moved along a longitudinal-axis extending linearly from the electron-emitter to the target material.

BRIEF DESCRIPTION OF THE DRAWINGS (DRAWINGS MIGHT NOT BE DRAWN TO SCALE)

FIG. 1 is a schematic, cross-sectional side-view of an x-ray source including a transmission-target x-ray tube 10, a focusing-ring 13, and a power supply 37, in accordance with an embodiment of the present invention.

Figure 2:
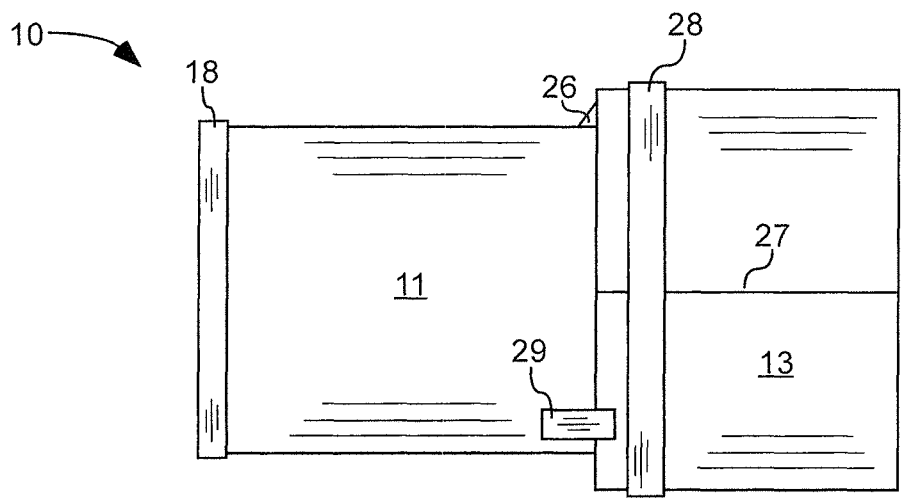

FIG. 2 is a schematic side-view of the x-ray tube 10 and focusing-ring 13 of FIG. 1, in accordance with an embodiment of the present invention.

Figure 3:
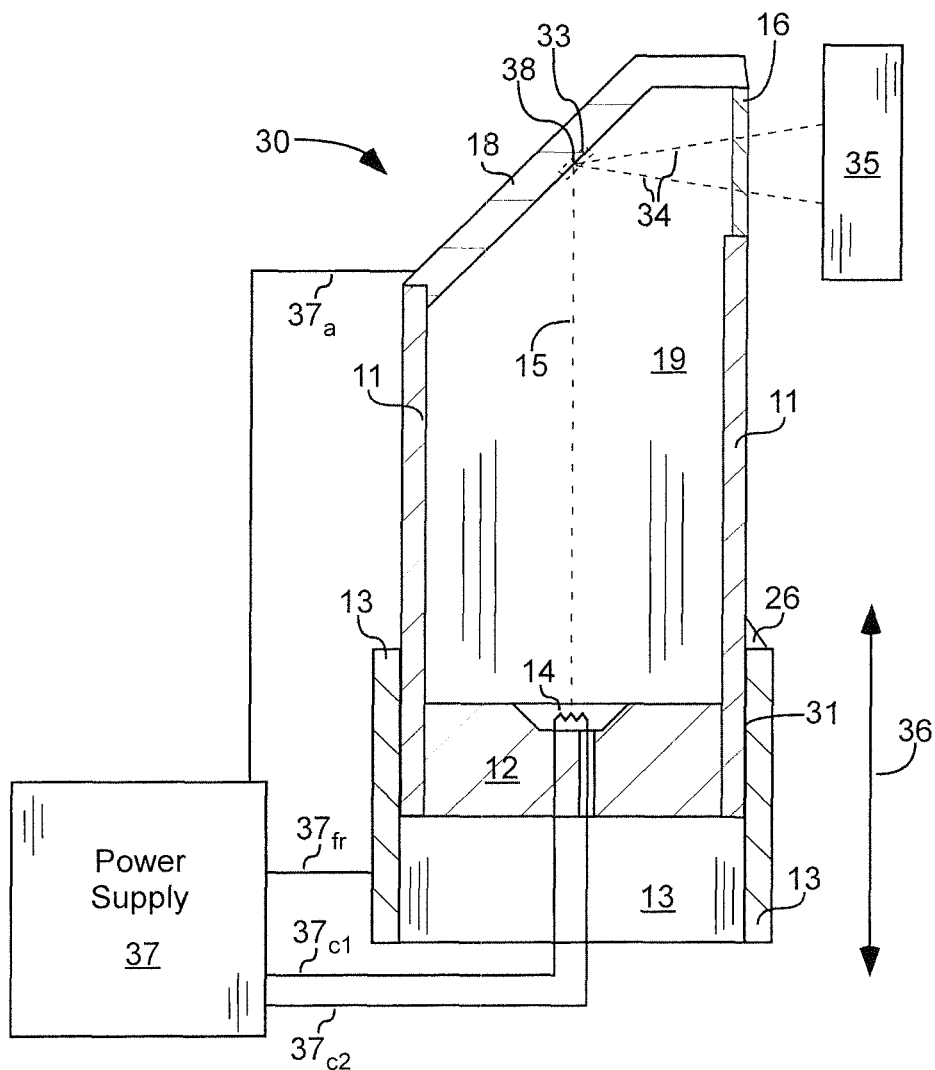

FIG. 3 is a schematic, cross-sectional side-view of an x-ray source including a side-window x-ray tube 30, a focusing-ring 13, and a power supply 37, in accordance with an embodiment of the present invention.

DETAILED DESCRIPTION

As illustrated in FIGS. 1-3, x-ray sources are shown including x-ray tubes 10 and 30, a focusing-ring 13, and a power supply 37. The x-ray tubes 10 and 30 can include an anode 18 and a cathode 12. The anode 18 can be electrically-conductive and can include a target material 38 configured for production and emission of x-rays 34 in response to impinging electrons. The cathode 12 can be electrically-conductive and can include an electron-emitter 14 capable of emitting electrons to the target material 38 on or in the anode 18, forming an electron-beam spot 33 on the anode 18. An evacuated-enclosure 11 can be attached to the cathode 12 and the anode 18 and can electrically-insulate the cathode 12 from the anode 18. Examples of materials of the evacuated-enclosure 11 include ceramic and glass.

As shown in FIG. 1, the target material can be on or in an x-ray window 16 part of the anode 18 of a transmission-target x-ray tube 10; and x-rays 34, formed in the target material 38 in response to impinging electrons, can transmit through the x-ray window 16 and out of the x-ray tube 10. As shown in FIG. 3, the target material 38 can be on or in the anode 18, but separate from the x-ray window 16, of a side-window x-ray tube 30; and x-rays 34, formed in the target material 38 in response to impinging electrons, can transmit through a hollow core 19 inside of the evacuated enclosure 11 to and through the x-ray window 16 and out of the x-ray tube 10. The x-ray window 16 of x-ray tubes 10 and 30 can include some or all of the properties (e.g. low deflection, high x-ray transmissivity, low visible and infrared light transmissivity) of the x-ray windows described in U.S. patent application Ser. No. 14/597,955, filed on Jan. 15, 2015, which is incorporated herein by reference in its entirety.

The x-ray sources can each include a focusing-ring 13, for tuning the electron-beam spot 33 to a predetermined characteristic (e.g. electron-beam spot 33 size, electron-beam spot 33 shape, electron-beam spot 33 location, or combinations thereof). The focusing-ring 13 can partially or completely encircle the electron-emitter 14, the cathode 12, the evacuated-enclosure 11, or combinations thereof, and can encircle such along a longitudinal-axis 15 of the x-ray tube 10 or 30. The longitudinal-axis 15 can extend linearly from the electron-emitter 14 to the target material 38. The focusing-ring 13 can tune the electron-beam spot 33 by moving 36 the focusing-ring 13 along the longitudinal-axis 15.

A relative-motion means can control motion of the focusing-ring 13 with respect to the electron-emitter 14. For example, the relative-motion means can be mating threads 22 between an interior of the focusing-ring 13 and an exterior of the x-ray tube 10 or 30; and the mating threads 22 on the exterior of the x-ray tube 10 or 30 can be on an exterior of the cathode 12, the evacuated-enclosure 11, or both. The mating threads 22 at an interior of the focusing-ring 13 can extend for various distances, depending on how much adjustment is needed. For example, the inner-threads of the focusing-ring 13 can extend for a distance d of between 5 millimeters and 40 millimeters in a direction parallel to the longitudinal-axis 15. Other examples of relative-motion means include rack and pinion 23, a piston, and human-pressure (e.g. changing the position of the focusing-ring 13 by hand-pressure).

Once the focusing-ring 13 is optimally located for desired electron-beam spot 33 size, shape, and location, it can be immovably fastened onto the x-ray tube 10 or 30. For example, the focusing-ring 13 can be immovably fastened by an adhesive, a set screw 24, a weld or solder 26, a clamp 28, press-fit, a connector 29, or combinations thereof.

The focusing-ring 13 can be located outside of a vacuum of the evacuated enclosure 11, which can result in one or more of the following benefits: (a) easier selection of materials for the focusing-ring 13 (some materials may be incompatible with the vacuum, due to outgassing or other issues); (b) the position of the focusing-ring 13 can be adjusted after forming the vacuum and without affecting the vacuum, thus allowing tuning the electron-beam spot 33 after sealing the x-ray tube 10 or 30; and (c) the evacuated-enclosure 11 can be smaller, allowing the x-ray tubes 10 or 30 to be inserted into smaller locations and reducing the cost of the evacuated-enclosure 11. The vacuum can be located at a hollow core 19 inside of the evacuated enclosure 11.

The focusing-ring 13 can have various sizes, for optimal tuning the electron-beam spot 33. For example, an inner-diameter D of the focusing-ring 13 can be at least 4 millimeters in one aspect, at least 8 millimeters in another aspect, or at least 16 millimeters in another aspect; and less than 30 millimeters in one aspect, less than 60 millimeters in another aspect, or less than 150 millimeters in another aspect. The focusing-ring 13 can be electrically-conductive and can be metallic, for optimal tuning the electron-beam spot 33.

The x-ray source can further comprise a power supply 37. The power supply 37 can provide a voltage differential (e.g. many kilovolts) between the electron-emitter 14 and the anode 18 and can provide electrical current to heat a filament if a filament is used as the electron-emitter 14.

The focusing-ring 13 can be electrically-coupled to the cathode 12 (see FIG. 1), and thus have the same voltage as the cathode 12. For example, electrical connector $37_{c1}$ can be electrically-coupled to the cathode 12, electrical connector $37_{c2}$ can be electrically-insulated from the cathode 12, thus allowing electrical current to flow through the electron-emitter 14 (if a filament is used), and the focusing-ring 13 can have the same voltage as electrical connector $37_{c1}$. Electrical connector $37_a$ can provide electrical voltage to the anode 18.

Alternatively, the focusing-ring 13 can be electrically-insulated from the cathode 12 (see FIG. 3), such as for example by the evacuated-enclosure 11, and the power supply 37 can provide a separate voltage to the focusing-ring 13 (e.g. via electrical connector $37_{fr}$). For example, the power supply 37 can be configured to maintain a voltage between the focusing-ring 13 and the cathode 12 of between 10 volts and 500 volts. Each of these two options (FIG. 1 or FIG. 2) has its advantages and disadvantages, and each may be preferable for specific x-ray source designs.

Method

A method of tuning an electron-beam spot 33 on a target material 38 in an x-ray tube 10 or 30 can comprise some or all of the following steps, which can be performed in the order specified. The x-ray tube 10 or 30 can include characteristics as described above.

1. Energizing the x-ray tube 10 or 30 to cause:
   a. emission of electrons from an electron-emitter 14 to the target material 38;
   b. creation of an electron-beam spot 33 where the electrons impinge on the target material 38; and
   c. emission of x-rays 34 from the target material 38.
2. Evaluating the electron-beam spot 33 with respect to predetermined characteristic(s). Examples of the predetermined characteristic(s) include one or more of the following: electron-beam spot 33 size, electron-beam spot 33 shape, and electron-beam spot 33 location. The evaluation can be accomplished by receiving the x-rays 34 into a detector 35 (e.g. CCD image sensor), the detector 35 determining actual characteristic(s) of the electron-beam spot 33, then the detector 35 comparing actual characteristic(s) to the predetermined characteristic(s). Alternatively, the comparison of actual characteristic(s) to the predetermined characteristic(s) can be performed manually.
3. Moving a focusing-ring 13 along a longitudinal-axis 15 of the x-ray tube 10 or 30 to tune the electron-beam spot 33 to the predetermined characteristic(s). The longitudinal-axis 15 can extend from the electron-emitter 14 inside the x-ray tube to the target material 38 on/in the anode 18. The movement can be done manually, or automatically by a computer. Moving can include threading the focusing-ring 13 on inner-threads of the focusing-ring 13 that mate with outer-threads on the x-ray tube, or other relative-motion means (see description above).
4. Repeat steps 2 and 3 until the actual characteristic(s) are sufficiently close to the predetermined characteristic(s).
5. Immovably fastening the focusing-ring 13 with respect to the electron-emitter 14. This can include one or more of the following:
   a. Inserting an adhesive into a gap 25 between the focusing-ring 13 and the x-ray tube 10 or 30.
   b. Tightening a set screw 24 in the focusing-ring 13 against the x-ray tube 10 or 30.
   c. Welding and/or soldering 26 the focusing-ring 13 onto the x-ray tube 10 or 30.
   d. Clamping the focusing-ring 13 onto the x-ray tube 10 or 30 (see clamp 28 in FIG. 2).
   e. Pinching the focusing-ring 13 shut against the x-ray tube 10 or 30. This can be accomplished by starting with a focusing-ring 13 that is a tube with a slotted opening or gap 27 along its length. Pressure can be applied to the focusing-ring 13 to partially or totally close the opening or gap 27 and thus press the focusing-ring 13 against the x-ray tube 10 or 30.
   f. Using a connector 29 to fasten the focusing-ring 13 to the x-ray tube 10 or 30.
   g. Press fit/friction fit/interference fit 31 between an interior of the focusing-ring 13 and an exterior of the x-ray tube 10 or 30.

Repeating this procedure with each x-ray tube of a given model, and using the same predetermined characteristic(s) for each (e.g. electron-beam spot 33 size, shape, and/or location), can reduce variation between x-ray tubes of that model.

What is claimed is:

1. A method of tuning an electron-beam spot on a target material in an x-ray tube, the method comprising the following steps performed in the following order:
   a) energizing the x-ray tube to cause:
      i) electrical current to flow through a filament, causing emission of electrons from the filament to the target material;

ii) creation of the electron-beam spot where the electrons impinge on the target material; and iii) emission of x-rays from the target material;

b) evaluating the electron-beam spot with respect to a predetermined characteristic by receiving the x-rays into a detector, determining an actual characteristic of the electron-beam spot, comparing the actual characteristic to the predetermined characteristic;

c) moving a focusing-ring along a longitudinal-axis of the x-ray tube to tune the electron-beam spot to the predetermined characteristic, the longitudinal-axis extending from the filament inside the x-ray tube to the target material; and d) immovably fastening the focusing-ring with respect to the filament.

2. The method of claim 1, wherein immovably fastening the focusing-ring includes:

a) inserting an adhesive into a gap between the focusing-ring and the x-ray tube;

b) tightening a set screw in the focusing-ring against the x-ray tube;

c) welding the focusing-ring onto the x-ray tube;

d) soldering the focusing-ring onto the x-ray tube;

e) clamping the focusing-ring onto the x-ray tube;

f) pinching the focusing-ring shut against the x-ray tube;

g) using a connector to fasten the focusing-ring to the x-ray tube;

h) interference fit between an interior of the focusing-ring and an exterior of the x-ray tube; or i) combinations thereof.

3. The method of claim 1, wherein moving the focusing-ring along the longitudinal-axis includes threading the focusing-ring on mating threads between an interior of the focusing-ring and an exterior of the x-ray tube.

4. The method of claim 1, wherein:

a) the x-ray tube further comprises an evacuated-enclosure that electrically-insulates a cathode from an anode;

b) the focusing-ring at least partially encircles the evacuated-enclosure; and c) the focusing-ring encircles the filament.

5. The method of claim 1, wherein the focusing-ring encircles at least a portion of the filament.

6. The method of claim 1, wherein the predetermined characteristic is electron-beam spot size, electron-beam spot shape, electron-beam spot location, or combinations thereof.

7. An x-ray source comprising:

a) an x-ray tube including:

i) an anode that is electrically-conductive and that includes a target material configured for production and emission of x-rays in response to impinging electrons;

ii) a cathode that is electrically-conductive and that includes a filament capable of emitting electrons towards the target material;

iii) an evacuated-enclosure attached to the cathode and the anode and that electrically-insulates the cathode from the anode;

b) a focusing-ring:

i) encircling the filament;

ii) including a relative-motion means for controlling motion of the focusing-ring with respect to the filament;

iii) located outside of a vacuum of the evacuated enclosure;

iv) capable of adjusting an electron-beam spot on the target material when moved along a longitudinal-axis extending linearly from the filament to the target material; and v) fastened immovably onto the x-ray tube.

8. The x-ray source of claim 7, wherein the relative-motion means includes mating threads between an interior of the focusing-ring and an exterior of the x-ray tube.

9. The x-ray source of claim 7, wherein the focusing-ring is fastened immovably onto the x-ray tube by an adhesive, a set screw, a weld, a solder, a clamp, press-fit, or combinations thereof.

10. An x-ray source comprising:

a) an x-ray tube including:

i) an anode that is electrically-conductive and that includes a target material configured for production and emission of x-rays in response to impinging electrons;

ii) a cathode that is electrically-conductive and that includes a filament capable of emitting electrons towards the target material;

iii) an evacuated-enclosure attached to, and that electrically-insulates, the cathode from the anode;

b) a focusing-ring:

i) at least partially encircling the filament, the cathode, the evacuated-enclosure, or combinations thereof;

ii) being electrically-conductive;

iii) located outside of a vacuum of the evacuated enclosure;

iv) capable of adjusting an electron-beam spot on the target material if moved along a longitudinal-axis extending linearly from the filament to the target material; and v) fastened immovably onto the x-ray tube.

11. The x-ray source of claim 10, wherein the x-ray source further comprises mating threads between an interior of the focusing-ring and an exterior of the x-ray tube.

12. The x-ray source of claim 10, wherein the focusing-ring is fastened immovably onto the x-ray tube by an adhesive, a set screw, a weld, a solder, a clamp, press-fit, or combinations thereof.

13. The x-ray source of claim 10, wherein the focusing-ring completely encircles the cathode along the longitudinal-axis.

14. The x-ray source of claim 10, wherein the focusing-ring is metallic and the focusing-ring encircles the filament.

15. The x-ray source of claim 10, wherein an inner-diameter of the focusing-ring is between 8 millimeters and 30 millimeters.

16. The x-ray source of claim 10, wherein the focusing-ring is electrically-coupled to the cathode.

17. The x-ray source of claim 10, further comprising a power supply, the focusing-ring is electrically-insulated from the cathode, and the power supply is configured to maintain a voltage between the focusing-ring and the cathode of between 10 volts and 500 volts.

18. The method of claim 1, wherein the detector automatically compares the actual characteristic to the predetermined characteristic.

19. The method of claim 1, wherein moving the focusing-ring along the longitudinal-axis is performed automatically by a computer.

20. The x-ray source of claim 7, wherein the relative-motion means includes mating threads between an interior of the focusing-ring and an exterior of the cathode and the mating threads extend for a distance of between 5 millimeters and 40 millimeters in a direction parallel to the longitudinal-axis.

* * * * *